(12) United States Patent
Lee et al.

(10) Patent No.: US 11,728,300 B2
(45) Date of Patent: Aug. 15, 2023

(54) SEMICONDUCTOR DEVICE

(71) Applicant: SAMSUNG ELECTRONICS CO., LTD., Suwon-si (KR)

(72) Inventors: Woon-Ki Lee, Yongin-si (KR); Jae-Won Kim, Seoul (KR); Jongsun Jung, Seongnam-si (KR); Chul-Joong Park, Incheon (KR); Ki-Bum Chun, Seoul (KR); Shivashanker Reddy Kesireddy, Suwon-si (KR); Sangwoo Pyo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 204 days.

(21) Appl. No.: 17/231,111

(22) Filed: Apr. 15, 2021

(65) Prior Publication Data
US 2022/0068853 A1 Mar. 3, 2022

(30) Foreign Application Priority Data
Aug. 26, 2020 (KR) ......................... 10-2020-0107830

(51) Int. Cl.
*H01L 23/522* (2006.01)
*H01L 23/528* (2006.01)
*H01L 23/00* (2006.01)

(52) U.S. Cl.
CPC .......... *H01L 24/06* (2013.01); *H01L 23/5226* (2013.01); *H01L 23/5286* (2013.01); *H01L 2224/02331* (2013.01); *H01L 2224/02373* (2013.01); *H01L 2224/0401* (2013.01); *H01L 2224/06131* (2013.01); *H01L 2224/06177* (2013.01)

(58) Field of Classification Search
CPC ....................................................... H01L 24/06
See application file for complete search history.

(56) References Cited

U.S. PATENT DOCUMENTS 6,770,963 B1 8/2004 Wu
7,224,056 B2 5/2007 Burtzlaff et al.
(Continued)

FOREIGN PATENT DOCUMENTS

KR 10-2010-0003911 A 1/2010
KR 10-1366949 B1 2/2014
(Continued)

*Primary Examiner* — William A Harriston
(74) *Attorney, Agent, or Firm* — Sughrue Mion, PLLC

(57) ABSTRACT

A semiconductor device includes a semiconductor substrate, an integrated device ort the semiconductor substrate, a first redistribution layer on the semiconductor substrate, the first redistribution layer having first conductive patterns electrically connected to the integrated device, a second redistribution layer on the first redistribution layer, the second redistribution layer having second conductive patterns connected to the first conductive patterns, and third conductive patterns on a top surface of the second redistribution layer. The third conductive patterns include pads connected to the second conductive patterns, under-bump pads spaced apart from the pads, a grouping pattern between the pads and an outer edge of the second redistribution layer, and wiring lines that connect the under-bump pads to the pads and connect the pads to the grouping pattern.

19 Claims, 14 Drawing Sheets

(56) References Cited

U.S. PATENT DOCUMENTS

| | | |
|---|---|---|
| 7,821,118 B1 | 10/2010 | Barot |
| 8,549,447 B2 | 10/2013 | Eisenstadt |
| 8,970,001 B2 | 3/2015 | Lii et al. |
| 9,577,025 B2 | 2/2017 | Gu et al. |
| 10,217,717 B2 | 2/2019 | Froidevaux et al. |
| 2010/0001379 A1 | 1/2010 | Lee et al. |
| 2012/0228777 A1 | 9/2012 | Yang et al. |
| 2013/0026618 A1* | 1/2013 | Chen .................... H01L 23/525 |
| | | 257/737 |
| 2015/0348916 A1 | 12/2015 | Chen et al. |
| 2018/0033753 A1 | 2/2018 | Camarota |

FOREIGN PATENT DOCUMENTS

| | | |
|---|---|---|
| KR | 10-1731684 B1 | 4/2017 |
| KR | 10-2019-0032580 A | 3/2019 |

\* cited by examiner

SEMICONDUCTOR DEVICE

CROSS-REFERENCE TO THE RELATED APPLICATION

This application claims priority from Korean Patent Application No. 10-700-0107830 filed on Aug. 26, 2020 in the Korean Intellectual Property Office, the disclosure of which is hereby incorporated by reference in its entirety.

BACKGROUND

1. Field

Apparatuses and methods consistent with example embodiments relate to a semiconductor device.

2. Related Art

A semiconductor die may be mounted on a package substrate in a wire bonding manner or a flip chip manner. When a semiconductor die is mounted in a flip chip manner, the semiconductor die may have pads for power supply, electrical ground, or signal transfer.

It is extremely important to supply a semiconductor chip with sufficient power to prevent an increase in simultaneous switching noise (SSN) during signal transmittance.

SUMMARY

It is an aspect to provide a semiconductor device having increased electrical characteristics.

It is another aspect to provide a semiconductor device with improved operating reliability.

According to an aspect of an example embodiment, there is provided a semiconductor device. The semiconductor device comprise: a semiconductor substrate; at least one integrated device on a front surface of the semiconductor substrate; a first redistribution layer on the semiconductor substrate, the first redistribution layer having a plurality of first conductive patterns electrically connected to the at least one integrated device; a second redistribution layer on the first redistribution layer, the second redistribution layer having plurality of second conductive patterns connected to the first conductive patterns; and a plurality of third conductive patterns on a top surface of the second redistribution layer. The third conductive patterns may include: a plurality of pads connected to the second conductive patterns; a plurality of under-bump pads spaced apart from the pads; a grouping pattern between the pads and an outer edge of the second redistribution layer; and a plurality of wiring lines that connect the under-bump pads to the pads and connect the pads to the grouping pattern.

According to another aspect of an example embodiment, there is provided a semiconductor device. The semiconductor device comprise: a semiconductor substrate that includes a plurality of integrated devices on a front surface of the semiconductor substrate; a redistribution layer on the semiconductor substrate; a plurality of pads and a plurality of under-bump pads on a central region of the redistribution layer; and a first grouping pattern on a peripheral region of the redistribution layer, the peripheral region being spaced apart from and surrounding the central region. The pads may include: a plurality of first pads connected to a signal circuit of the integrated devices; and a plurality of second pads connected to the first grouping pattern and a ground circuit of the integrated devices.

According to yet another aspect of an example embodiment, there is provided a semiconductor device comprising a semiconductor die; a dielectric pattern on an active surface of the semiconductor die; a first conductive pattern in the dielectric pattern; a second conductive pattern on a top surface of the dielectric pattern; and a plurality of solder bumps on the second conductive pattern. The second conductive pattern may include: a grouping pattern having a ring shape that extends along an outer edge of the dielectric pattern; a plurality of under-bump pads on the top surface of the dielectric pattern; and a plurality of die pads connected to the under-bump pads and the grouping pattern. A distance from the outer edge of the dielectric pattern to the grouping, pattern is less than a distance from the outer edge of the dielectric pattern to the plurality of under-bump pads and the distance from the outer edge of the dielectric pattern to the grouping pattern is less than a distance from the outer edge of the dielectric pattern to the plurality of die pads. A plurality of ground circuits in the semiconductor die may be connected to the grouping pattern and have the same electrical potential.

DETAILED DESCRIPTION

The above and other aspects and features will become more apparent by describing in detail example embodiments with reference to accompanying drawings.

Figure 1:
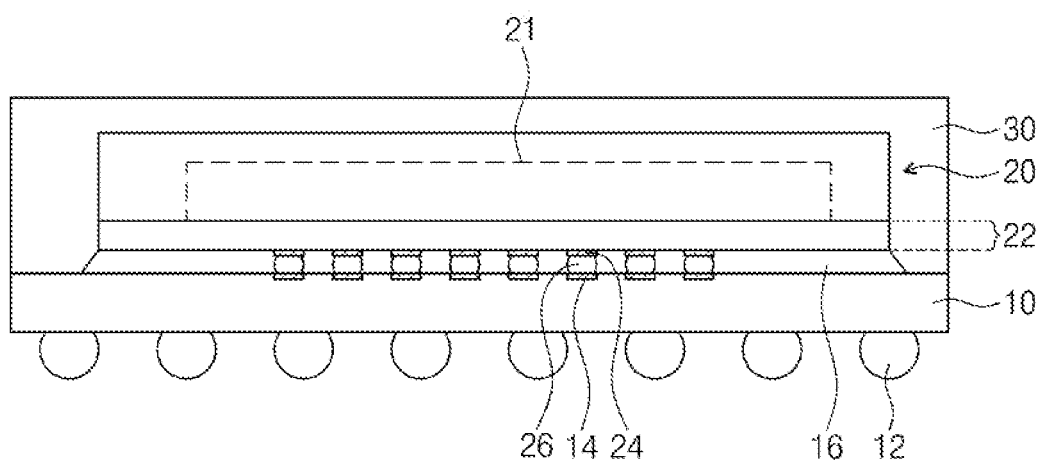
FIG. 1 illustrates a cross-sectional view showing a semiconductor device according to some example embodiments.

FIG. 1 illustrates cross-sectional view showing a semiconductor device according to some example embodiments.

Referring to FIG. 1, a package substrate 10 may be provided. The package substrate 10 may be a printed circuit board (PCB). The package substrate 10 may include circuit patterns (not shown). One or more of the circuit patterns may be electrically connected to first substrate pads (not shown) on a bottom surface of the package substrate 10. The first substrate pads may be correspondingly attached thereto with external coupling terminals 12, such as solder bumps or solder balls, which can electrically connect the package substrate 10 to an external apparatus. Other one or more of the circuit patterns may be electrically connected to second substrate pads 14 on a top surface of the package substrate 10.

A semiconductor die 20 may be mounted on the package substrate 10. The semiconductor die 20 may have a bottom surface that faces the package substrate 10 and a top surface opposite to the bottom surface. The bottom surface may be an active surface of the semiconductor die 20. The semiconductor die 20 may include at least one integrated device 21 therein. The at least one integrated device 21 may be formed on a lower portion of the semiconductor die 20. The semiconductor die 20 may include a redistribution layer 22 provided on the bottom surface thereof. The redistribution layer 22 may be coupled to the at least one integrated device 21. A configuration of the semiconductor die 20 will be further discussed in detail below.

The semiconductor die 20 may be flip-chip mounted on the package substrate 10. For example, the semiconductor die 20 may be disposed to allow the redistribution layer 22 to face the package substrate 10. The semiconductor die 20 may be coupled through connection terminals 26 to the package substrate 10. The connection terminals 26 may be provided between the second substrate pads 14 of the package substrate 10 and under-bump pads 24 of the redistribution layer 22. The connection terminals 26 may include a micro-bump.

An under-fill layer 16 may fill a space between the semiconductor die 20 and the package substrate 10. The under-fill layer 16 may surround the connection terminals 26. The under-fill layer 16 may be an epoxy, a silicon-based dielectric layer, or a tape.

A molding layer 30 may be provided on the package substrate 10. The molding layer 30 may cover the semiconductor die 20. The molding layer 30 may protect the semiconductor die 20 from external environment. The molding layer 30 may include an epoxy molding compound (EMC).

Figure 2:
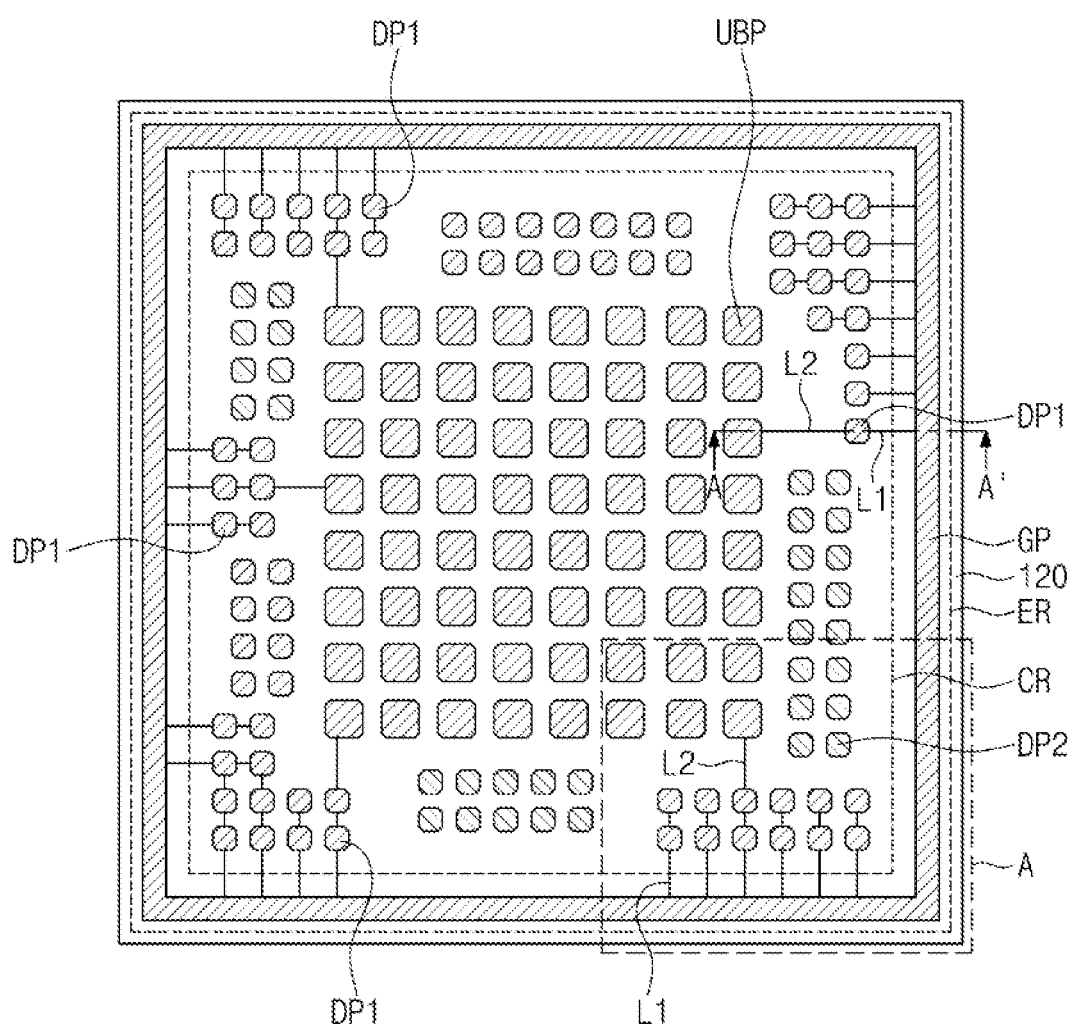
FIG. 2 illustrates a plan view showing a semiconductor device according to some example embodiments.
Figure 3:
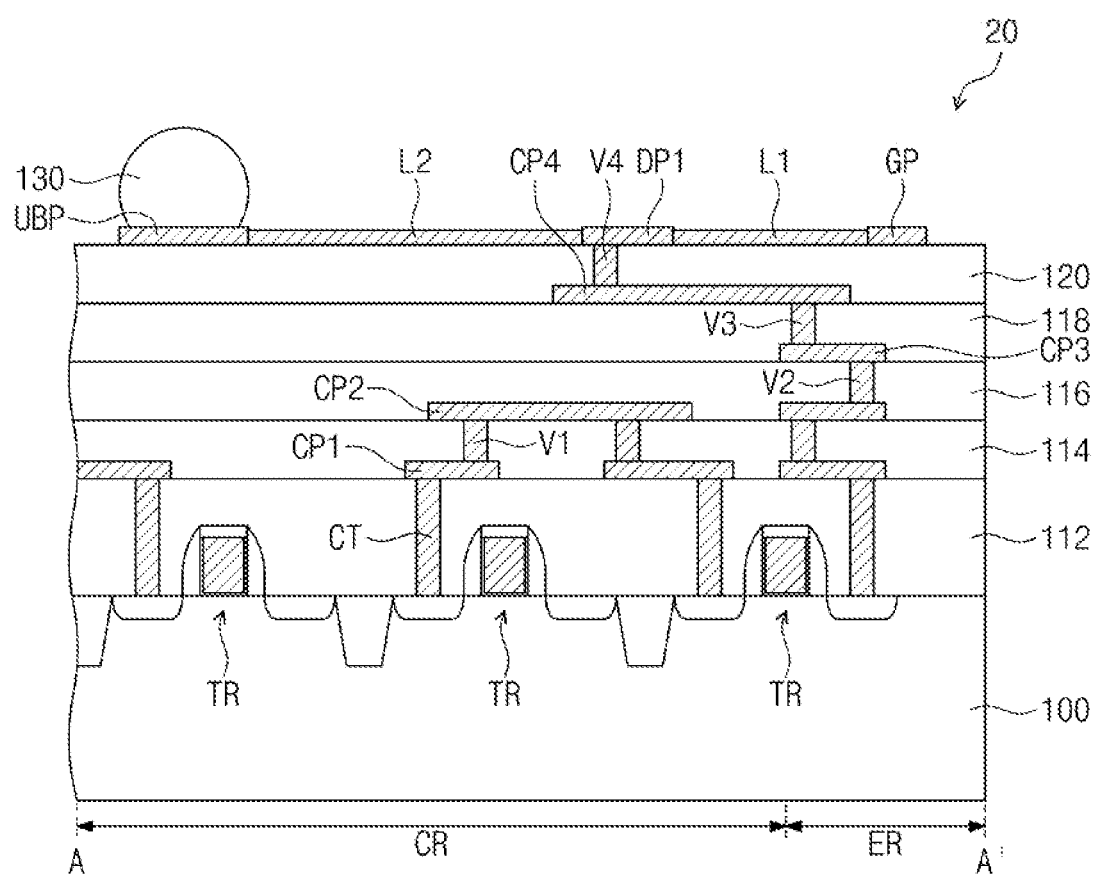
FIG. 3 illustrates a cross-sectional view taken along line A-A' of the semiconductor device of FIG. 7.
Figure 4:
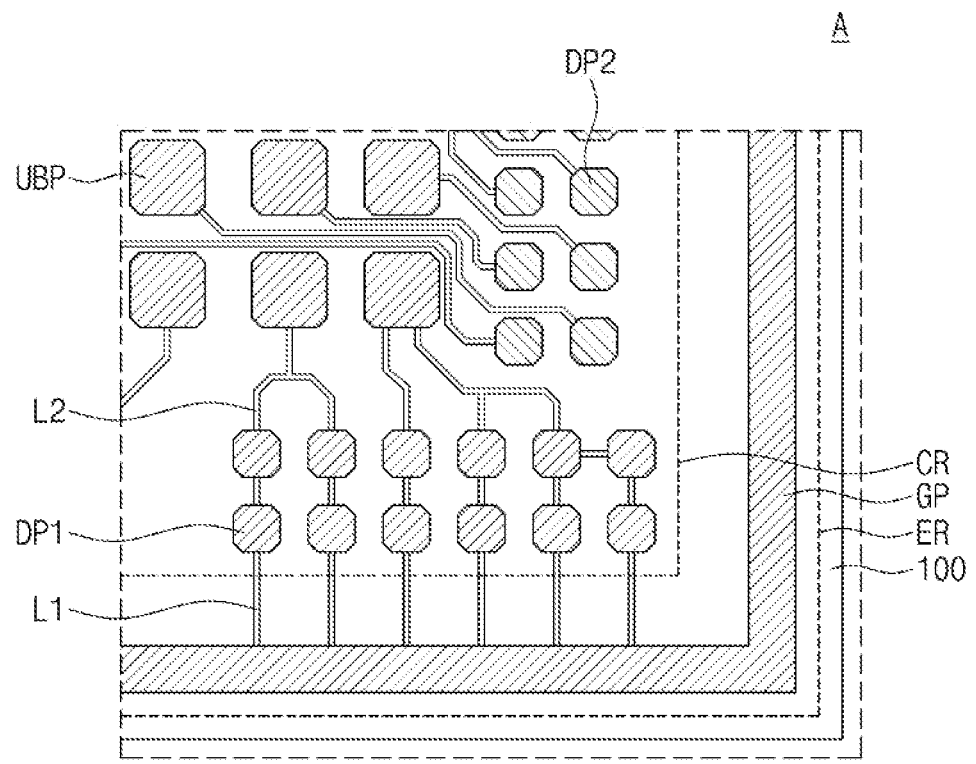
FIG. 4 illustrates an enlarged view showing section A of the semiconductor device of FIG. 2.

FIG. 2 illustrates a plan view of a semiconductor device according to some example embodiments, showing an arrangement of die pads and under-bump pads. In FIG. 2, illustration of some components (e.g., wiring lines) is omitted for convenience of description. FIG. 3 illustrates a cross-sectional view taken along line A-A' of FIG. 2, showing a semiconductor device according to some example embodiments. FIG. 4 illustrates an enlarged view showing section A of FIG. 2.

Referring to FIGS. 2 and 3, the semiconductor die 20 may include a semiconductor substrate 100, a first redistribution layer 112, a second redistribution layer 114, a third redistribution layer 118, a fourth redistribution layer 118, and a fifth redistribution layer 120 stacked on the semiconductor substrate 100, and under bump pads UBP, first die pads DP1, second die pads DP2, and a grouping pattern GP provided on the fifth redistribution layer 120 located at the topmost position.

The semiconductor substrate 100 may be provided. The semiconductor substrate 100 may include a silicon (Si) substrate, a germanium (Ge) substrate, or a silicon-germanium (SiGe) substrate. The semiconductor substrate 100 may have a front surface that faces the first to fifth redistribution layers 112 to 120 and a rear surface opposite to the front surface. In this description, the language "front surface" may be defined to indicate an active surface of an integrated device in a semiconductor chip or a surface on which are formed pads of a semiconductor chip, and the language "rear surface" may be defined to indicate a surface opposite to the front surface.

One or more integrated devices may be provided on the front surface of the semiconductor substrate 100. The one or more integrated devices may correspond to the integrated device 21 discussed with reference to FIG. 1. The one or more integrated devices may include a memory circuit, a logic circuit, an electrostatic discharge (ESD) protection circuit, or a combination thereof. For example, the one or more integrated devices may include a plurality of transistors TR that constitute a memory circuit, a logic circuit, an electrostatic discharge (ESD) protection circuit or a combination thereof. Each of the transistors TR may include a gate electrode and impurity regions on opposite sides of the gate electrode. The impurity regions may be impurity-doped areas in the semiconductor substrate 100. The semiconductor substrate 100 may include therein device isolation layers adjacent to the transistors TR. In this description, the transistors TR are illustrated to have planar gate structures, but example embodiments are not limited thereto. According to some example embodiments, the transistors TR may have their gate structures of Fin-FET devices.

The first, second, third, fourth, and fifth redistribution layers 112, 114, 116, 118, and 120 may be stacked on the semiconductor substrate 100. In some example embodiments, the redistribution layer 22 discussed with reference to FIG. 1 may include the first, second, third, fourth, and fifth redistribution layers 112, 114, 116, 118, and 120. Each of the first, second, third, fourth, and fifth redistribution layers 112, 114, 116, 118, and 120 may include, for example, a silicon oxide ($SiO_2$) layer, a silicon nitride (SiN) layer, a silicon oxynitride layer, or a low-k dielectric layer (e.g., SiCOH or SiOF) whose dielectric constant is less than that of a silicon oxide layer. According to some example embodiments, the fifth redistribution layer 120 located at the topmost position may be a passivation layer. For example, the fifth redistribution layer 120 may include a dielectric polymer.

The first redistribution layer 112 located at the bottommost position may cover the transistors TR. At least one contact CT may penetrate the first redistribution layer 112 to come into connection with one of the impurity regions of the transistors TR.

The second redistribution layer 114 may be stacked on the first redistribution layer 112. A first conductive pattern CP1 may be disposed in the second redistribution layer 114. The first conductive pattern CP1 may be electrically connected to the at least one contact CT of the first redistribution layer 112.

The third redistribution layer 116 may be stacked on the second redistribution layer 114. A second conductive pattern CP2 may be disposed in the third redistribution layer 116. The second conductive pattern CP2 may be electrically connected to the first conductive pattern CP1 of the second redistribution layer 114 through first vias V1 formed in the second redistribution layer 114.

The fourth redistribution layer 118 may be stacked on the third redistribution layer 116. A third conductive pattern CP3 may be disposed in the fourth redistribution layer 118. The third conductive pattern CP3 may be electrically connected to the second conductive pattern CP2 of the third redistribution layer 116 through second vias V2 formed in the third redistribution layer 116.

The fifth redistribution layer 120 may be stacked on the fourth redistribution layer 118. A fourth conductive pattern CP4 may be disposed in the fifth redistribution layer 120. The fourth conductive pattern CP4 may be electrically connected to the third conductive pattern CP3 of the fourth redistribution layer 118 through third vias V3 formed in the fourth redistribution layer 118. The fifth redistribution layer 120 may include therein fourth vias V4 connected to the fourth conductive pattern CP4.

The contact CT and the first to fourth conductive patterns CP1 to CP4 may include metal, such as copper or tungsten.

At least one metal diffusion stop layer (not shown) may be disposed in the first, second, third, fourth, and fifth redistribution layers 112, 114, 116, 118, and 120. The metal diffusion stop layer may include SiN, SiCN, SiOCN, SiON, or SiC. The metal diffusion stop layer may prevent diffusion of metal components included in the first, second, third, and fourth conductive patterns CP1, CP2, CP3, and CP4 and the first, second, third, and fourth vias V1, V2, V3, and V4 disposed in the first, second, third, fourth, and fifth redistribution layers 112, 114, 116, 118, and 120. While FIG. 3 depicts five redistribution layers 112, 114, 116, 118, and 120 by way of example, example embodiments are not limited thereto. In some example embodiments, the number of redistribution layers may be more or less than five. For example, for a semiconductor device, the semiconductor die 20 may have two or more redistribution layers.

The fifth redistribution layer 120 may be provided thereon with the under-bump pads UBP, the first die pads DP1, the second die pads DP2, and the grouping pattern GP.

Referring to FIGS. 2 to 4, the semiconductor substrate 100 may have, on its central region CR, the under-bump pads UBP disposed on a top surface of the fifth redistribution layer 120. The central region CR may correspond to an area where are provided the under-bump pads UBP, the first die pads DP1, the second die pads DP2, and first wiring layers L1 and second wiring lines L1 L2. When viewed in plan view, the under-bump pads UBP may be two-dimensionally arranged in a plurality of row and columns. FIG. 2 depicts an exemplary arrangement of the under-bump pads UBP, but example embodiments are not limited thereto. The under-bump pads UBP may be supplied with data signals, power voltages, or ground voltages through the package substrate 10 of FIG. 1.

Connection terminals 130 may be correspondingly provided on top surfaces of the under-bump pads UBP. In this case, the under-bump pads UBP may be provided to couple the semiconductor die 20 through the connection terminals 130 to the package substrate 10. For example, the connection terminals 130 may allow the semiconductor die 20 to have flip-chip connection with the package substrate 10 or may allow other semiconductor die to have connection with the semiconductor die 20. The connection terminals 130 may correspond to the connection terminals 26 discussed with reference to FIG. 1. The connection terminals 130 may include a micro-bump.

The semiconductor substrate 100 may have, on the central region CR, the first die pads DP1 disposed on the top surface of the fifth redistribution layer 120. The first die pads DP1 may be coupled to the fourth conductive pattern CP4 of the fifth redistribution layer 120. The first die pads DP1 may be connected through the first, second, third, fourth, and fifth redistribution layers 112, 114, 116, 118, and 120 to the integrated devices of the semiconductor substrate 100. The first die pads DP1 may be supplied with ground voltages. For example, the first die pads DP1 may be connected to at least one of the transistors TR formed on the semiconductor substrate 100, and an electrostatic discharge (ESD) protection circuit may be constituted by the transistors TR connected to the first die pads DP1. As shown in FIG. 4, the first die pads DP1 may be connected through the second wiring line L2 to at least one of the under-bump pads UBP. For example, ground voltages provided through the under-bump pads UBP may be transferred through the second wiring line L2 to the first die pads DP1.

The semiconductor substrate 100 may have, on the central region CR, the second die pads DP2 disposed on the top surface of the fifth redistribution layer 120. The second die pads DP2 may be coupled to the fourth conductive pattern CP4 of the fifth redistribution layer 120. The second die pads DP2 may be connected through the first, second, third, fourth, and fifth redistribution layers 112, 114, 116, 118, and 120 to the integrated devices of the semiconductor substrate 100. The second die pads DP2 may be supplied with data signals or power voltages. For example, the second die pads DP2 may be connected to at least one of the transistors TR formed on the semiconductor substrate 100, and a memory or logic circuit may be constituted by the transistors TR connected to the second die pads DP2. As shown in FIG. 4, the second die pads DP2 may be connected through a certain wiring line to at least one of the under-bump pads UBP. For example, data signals or ground voltages provided through the under-bump pads UBP may fie transferred through the certain wiring line to the second die pads DP2.

According to some example embodiments, the first die pads DP1 may be supplied with power voltages, and the second die pads DP2 may be supplied with data signals or ground voltages.

The interconnection relationship between the under-bump pads UBP and the first and second die pads DP1 and DP2 is illustrated by way of example. However, example embodiments are not limited to that shown in figures.

The semiconductor substrate 100 may have, on the peripheral region ER, the grouping pattern GP disposed on the top surface of the fifth redistribution layer 120. The peripheral region ER may be provided along an outer edge of the semiconductor substrate 100. For example, when viewed in plan view, the peripheral region ER may surround the central region CR. The grouping pattern GP may have a ring shape that extends along the peripheral region ER as shown in FIG. 2. Therefore, when viewed in plan view, the under-bump pads UBP, the first die pads DP1, and the second die pads DP2 may be disposed inside the growing pattern GP. For example, the grouping pattern GP and the outer edge of the fifth redistribution layer 120 that is adjacent to the grouping pattern GP may be provided therebetween with none of the under-bump pads UBP, the first die pads DP1 and the second die pads DP2. As shown in FIGS. 2 and 3, on a straight line that links a center of the fifth redistribution layer 120 and an outer edge of the fifth redistribution layer 120, the grouping pattern GP may be positioned closer than the first or second die pads DP1 or DP2 to the outer edge of the fifth redistribution layer 120. A distance from the outer edge of the fifth redistribution layer 120 to the grouping pattern GP may be about 4 μm to about 80 μm.

The grouping pattern GP may be connected to the first die pads DP1. For example, the first die pads DP1 may be coupled through the first wiring lines L1 to the grouping pattern GP. In some example embodiments, the first die pads DP1 may all be connected to the grouping pattern GP to be combined in a group. Therefore, the first die pads DP1 and the grouping pattern GP may decrease in overall resistance, and the semiconductor die 20 may increase in electrical characteristics.

Moreover, in some example embodiments, the grouping pattern GP may mutually connect ground circuits or electrostatic discharge (ESD) protection circuits of the integrated devices formed on the semiconductor substrate 100 and may supply uniform ground voltages to the ground circuits or the ESD protection circuits, and the semiconductor die 20 may increase in operating reliability.

In addition, because the grouping pattern GP is provided on the peripheral region ER of the semiconductor die 20, the grouping pattern GP may protect the first die pads DP1, the second die pads DP2, the under-bump pads UBP, and the first and second wiring lines L1 and L2 against stress or strain delivered from the outer edge of the fifth redistribution layer 120 during fabrication processes. For example, the grouping pattern GP may protect the first die pads DP1, the second die pads DP2, the under-bump pads UBP and the first and second wiring lines L1 and L2 during a sawing process for the semiconductor die 20. Accordingly, a semiconductor device may increase in structural stability.

The under-bump pads UMP, the first die pads DP1, the second die pads DP2, and the grouping pattern GP may be located at the same level from the semiconductor substrate 100. For example, the under-bump pads UBP, the first die pads DP1, the second die pads DP2, and the grouping pattern GP may be simultaneously formed by patterning a conductive layer coated on the top surface of the fifth redistribution layer 120. In this case, the first and second wiring lines L1 and L2 and other wiring lines may also be formed together. The under-bump pads UBP the first die pads DP1, the second die pads DP2, and the grouping pattern GP may include a conductive material. For example, the conductive material may include copper (Cu) or tungsten (W).

Figure 5:
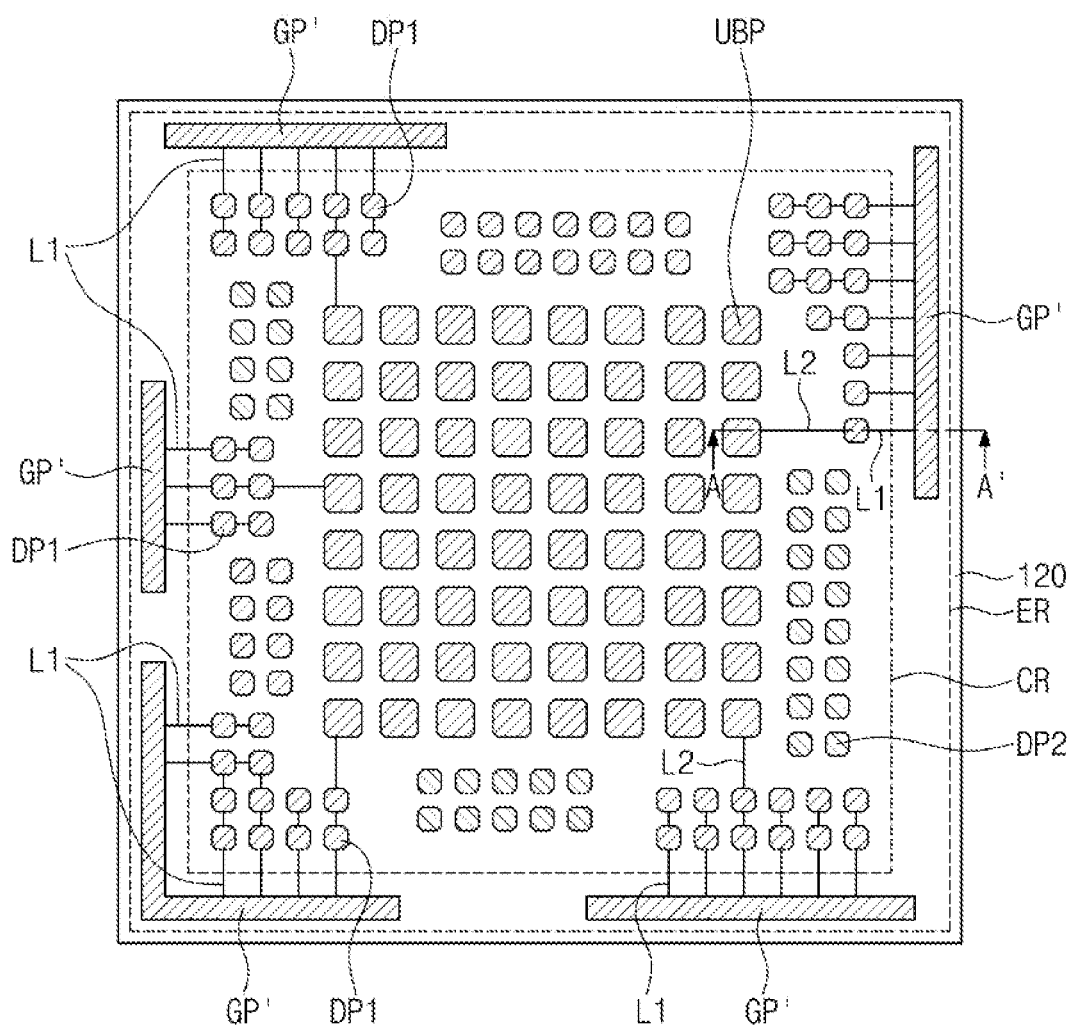
FIG. 5 illustrates a plan view showing a semiconductor device according to some example embodiments.

According to some example embodiments, a plurality of grouping patterns may be provided. FIG. 5 illustrates a plan view of a semiconductor device according to some example embodiments, showing a grouping pattern in accordance with another example embodiment.

Referring to FIG. 5, a plurality of grouping patterns GP' may be provided. The grouping patterns GP' may be disposed on the fifth redistribution layer 120 on the peripheral region ER. The grouping patterns GP' may be arranged along the outer edge of the fifth redistribution layer 120. Each of the grouping patterns GP' may be connected through adjacent first die pads DP1 and an adjacent first wiring line L1. According to the example embodiment illustrated in FIG. 5, the grouping patterns GP' may be disposed on positions adjacent to the first die pads DP1, and therefore the first and second die pads DP1 and DP2, the under-bump pads UBP, and the first and second wiring lines L1 and L2 may have increased areas on the top surface of the fifth redistribution layer 120, and the degree of wiring freedom may increase.

Figure 6:
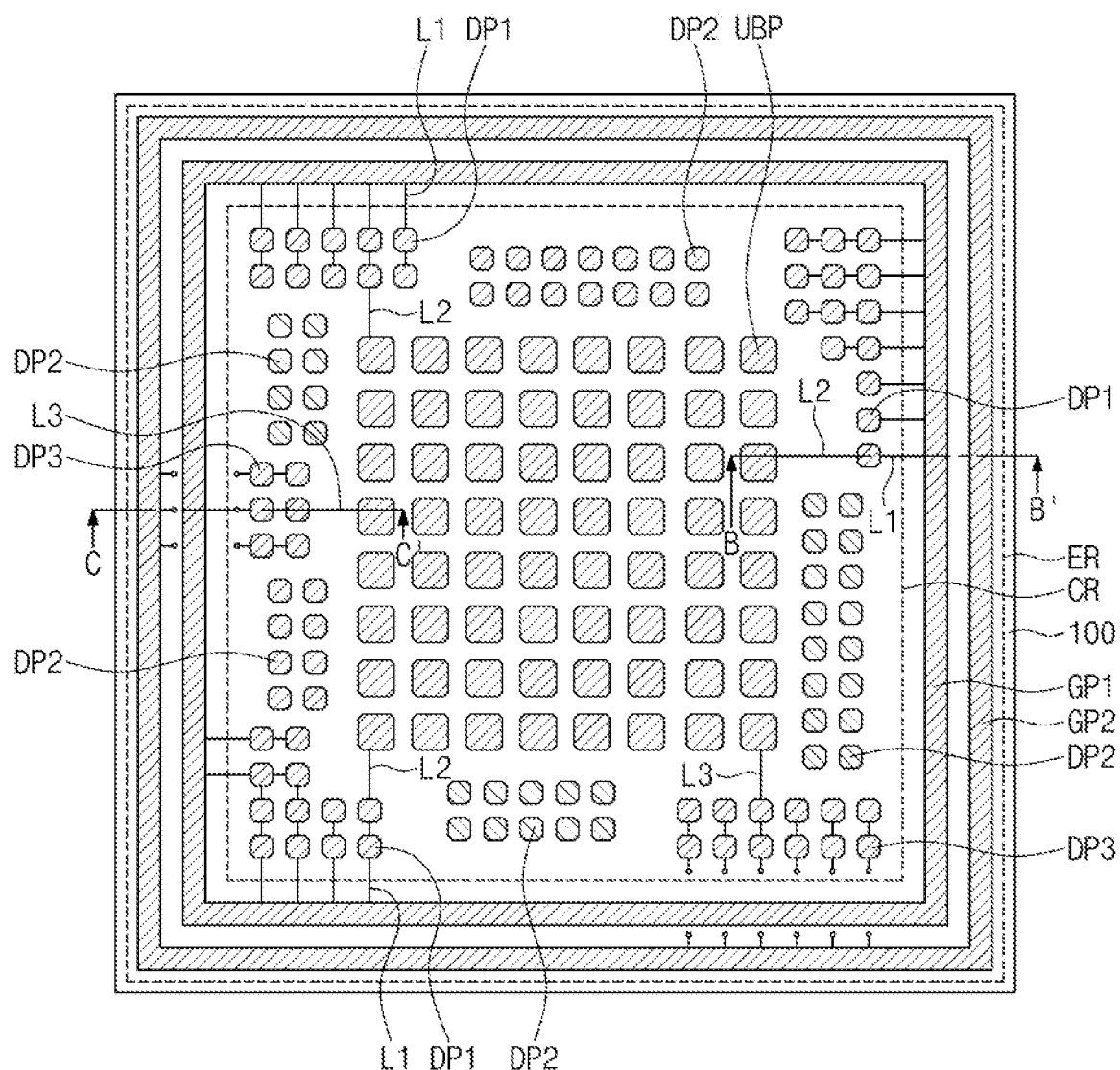
FIG. 6 illustrates a plan view showing a semiconductor device according to some example embodiments.
Figure 7:
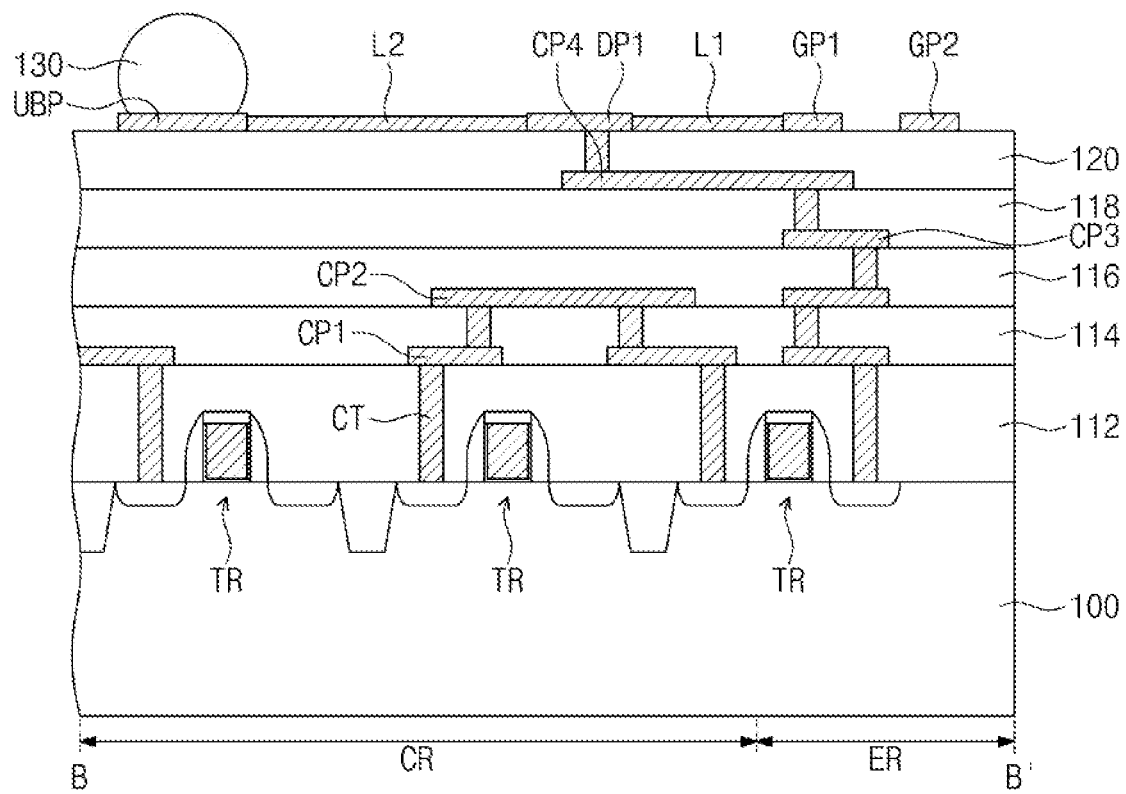
FIGS. 7 and S illustrate enlarged cross-sectional views showing sections B-B' and C-C', respectively, of the semiconductor device of FIG. 6, according to some example embodiments.
Figure 8:
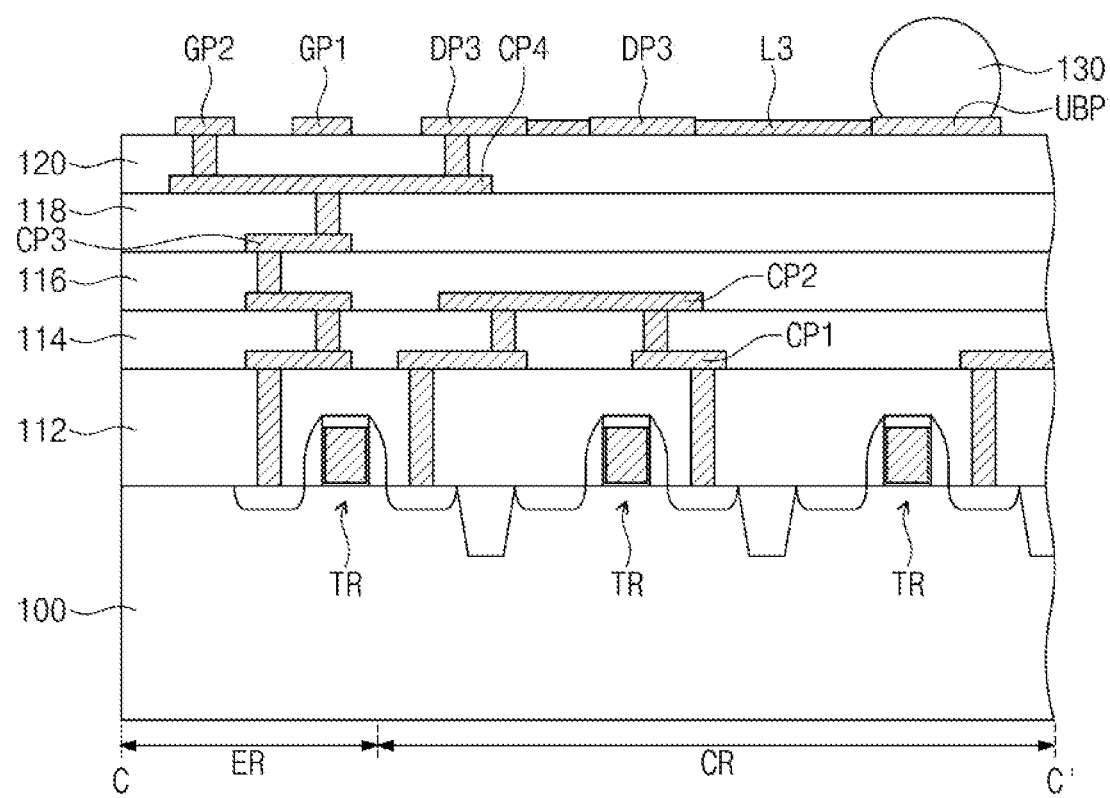

FIG. 6 illustrates a plan view of a semiconductor device according to some example embodiments, showing an arrangement of die pads and under-bump pads. In FIG. 6, illustration of some components (e.g., wiring lines) is omitted for convenience of description and for conciseness. FIGS. 7 and 8 illustrate cross-sectional views respectively taken along lines B-B' and C-C' of FIG. 6. In the example embodiment illustrated in FIGS. 6-8, the same reference numerals will be allocated to the same components of the semiconductor device discussed above with reference to FIGS. 1-4, and a detailed description of technical features repetitive to those discussed with reference to FIGS. 1 to 4 will be omitted for conciseness, and a difference thereof will be discussed in detail.

Referring to FIGS. 6 to 8, the fifth redistribution layer 120 may be provided thereon with under-bump pads UBP, first die pads DP1, second die pads DP2, third die pads DP3, and grouping patterns GP1 and GP2. The under-bump pads UBP, the first die pads DP1, and the second die pads DP2 may be the same as the under-bump pads UBP, the first die pads DP1, and the second die pads DP2, respectively, discussed with reference to FIGS. 2 to 4.

The first die pads DP1 may be pads through which ground voltages are supplied to the integrated devices of the semiconductor substrate 100, and the second die pads DP2 may be pads through which data signals are supplied to the integrated devices of the semiconductor substrate 100.

The semiconductor substrate 100 may have, on the central region CR, the third die pads DP3 disposed on the top surface of the fifth redistribution layer 120. The third die pads DP3 may be coupled to the fourth conductive pattern CP4 of the fifth redistribution layer 120. The third die pads DP3 may be connected through the first, second, third, fourth, and fifth redistribution layers 112, 114, 116, 118, and 120 to the integrated devices of the semiconductor substrate 100. The third die pads DP3 may be supplied with power voltages. For example, the third die pads DP3 may be connected to at least one of the transistors TR formed on the semiconductor substrate 100, and a memory or logic circuit may be constituted by the transistors TR connected to the third die pads DP3. As shown in FIG. 6, the third die pads DP3 may be connected through a third wiring line L3 to at least one of the under-bump pads UBP. For example, power voltages provided through the under-bump pads UBP may be transferred through the third wiring line L3 to the third die pads DP3.

A plurality of grouping patterns GP1 and GP2 may be provided. For example, a first grouping pattern GP1 and a second grouping pattern GP2 may be disposed on the fifth redistribution layer 120 on the peripheral region ER. Each of the first and second grouping patterns GP1 and GP2 may extend along the outer edge of the fifth redistribution layer 120. The first grouping pattern GP1 may have a ring shape that extends along the peripheral region ER. The second grouping pattern GP2 may have a ring shape that extends along the peripheral region ER.

When viewed in plan view, the first grouping pattern GP1 may be disposed inside the second grouping pattern GP2. The first grouping pattern GP1 may be spaced apart from the second grouping pattern GP2. The second grouping pattern GP2 may be closer than the first grouping pattern GP1 to the outer edge of the fifth redistribution layer 120. When viewed in plan view, the under-bump pads UBP, the first die pads DP1, the second die pads DP2, and the third die pads DP3 may be disposed inside the first grouping pattern GP1.

The first grouping pattern GP1 may be connected to the first die pads DP1. In some example embodiments, the first die pads DP1 may all be coupled to the first grouping pattern GP1, and the first grouping pattern GP1 may be connected through the first die pads DP1 to ground circuits or electrostatic discharge (ESD) protection circuits of the integrated devices formed on the semiconductor substrate 100. For example, the first die pads DP1 may be coupled through the first wiring lines L1 to the first grouping pattern GP1. In some example embodiments, the first die pads DP1 may all be connected to the first grouping pattern GP1 to be combined in a group. Therefore, the first die pads DP1 and the first grouping pattern GP1 may decrease in overall resistance, and the semiconductor die 20 may increase in electrical characteristics. In some example embodiments, the first grouping pattern GP1 may mutually connect ground circuits or electrostatic discharge (ESD) protection circuits of the integrated devices formed on the semiconductor substrate 100 and may supply uniform ground voltages to the ground circuits or the ESD protection circuits. Accordingly, the semiconductor die 20 may increase in operating reliability.

The second grouping pattern GP2 may be connected to the third die pads DP3. In some example embodiments, the third die pads DP3 may all be coupled to the second grouping pattern GP2, and the second grouping pattern GP2 may be connected through the third die pads DP3 to a memory or logic circuit of the integrated devices formed on the semiconductor substrate 100. For example, each of the third die pads DP3 may be coupled to the second grouping pattern GP2 through the fourth conductive pattern CP4 of the fifth redistribution layer 120. The third die pads DP3 may all be connected to the second grouping pattern GP2 to be combined in a group. Therefore, the third die pads DP3 and the second grouping pattern GP2 may decrease in overall resistance, and the semiconductor die 20 may increases in electrical characteristics. The second grouping pattern GP2 may supply uniform power voltages to a memory or logic circuit of the integrated devices formed on the semiconductor substrate 100. Accordingly, the semiconductor die 20 may increase in operating reliability.

Figure 9:
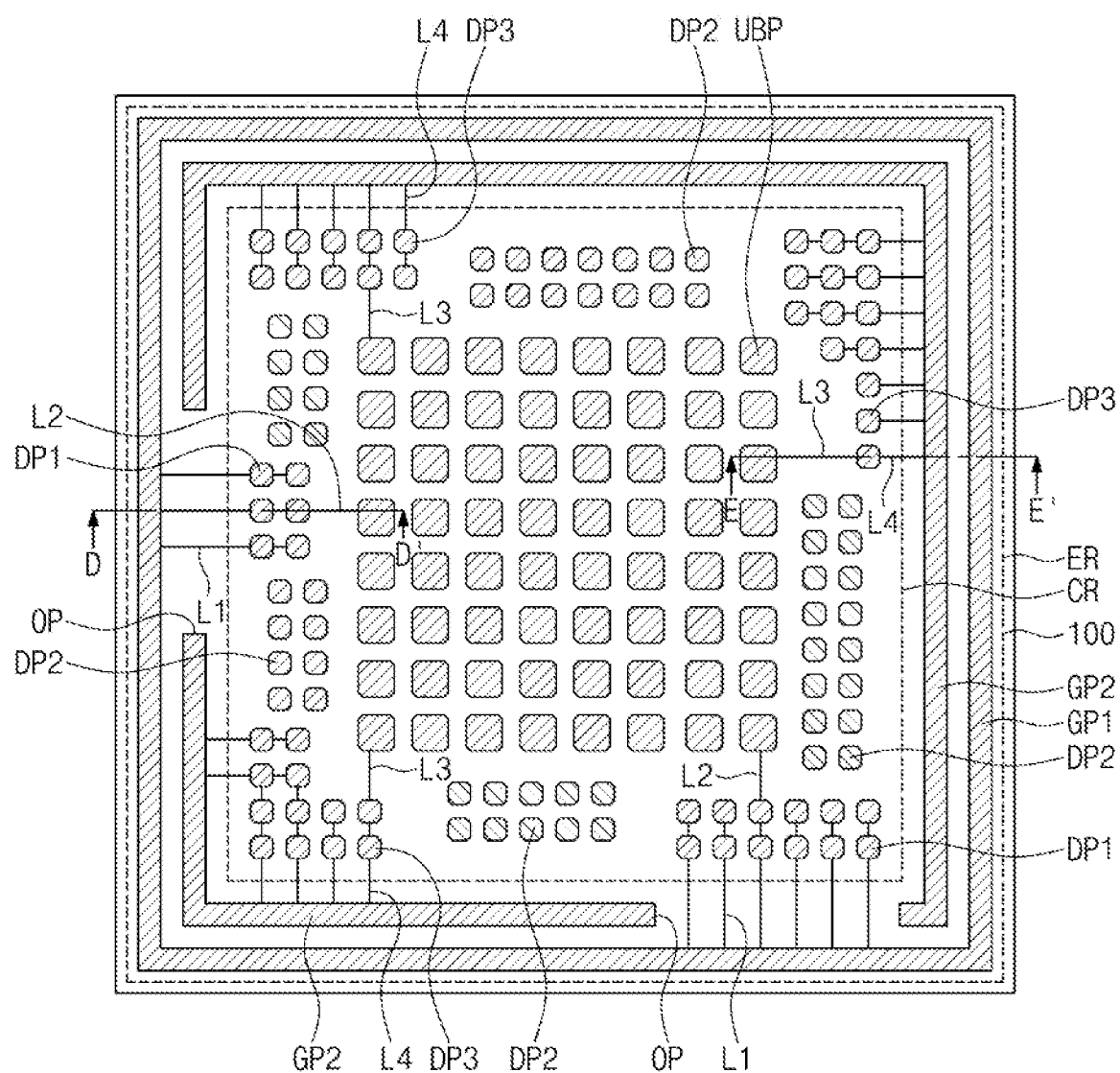
FIG. 9 illustrates a plan view showing a semiconductor device according to some example embodiments.
Figure 10:
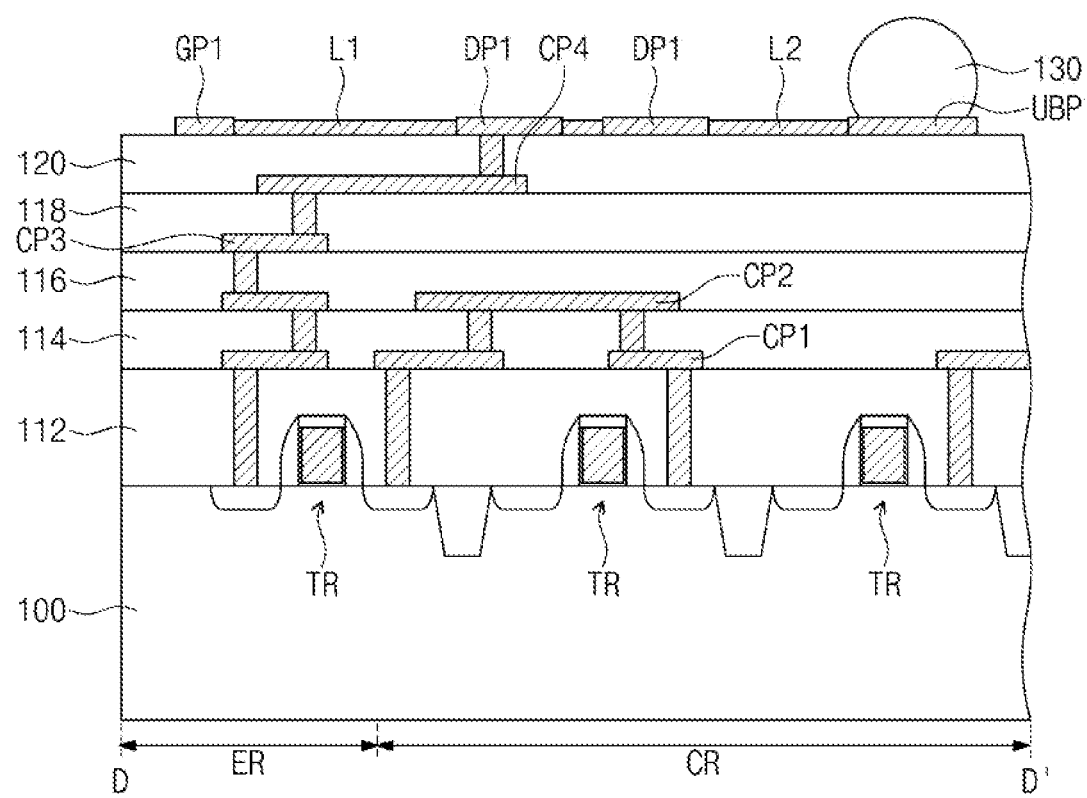
FIGS. 10 and 11 illustrate cross-sectional views showing, sections D-D' and E-E', respectively, of the semiconductor device of FIG. 9, according to some example embodiments.
Figure 11:
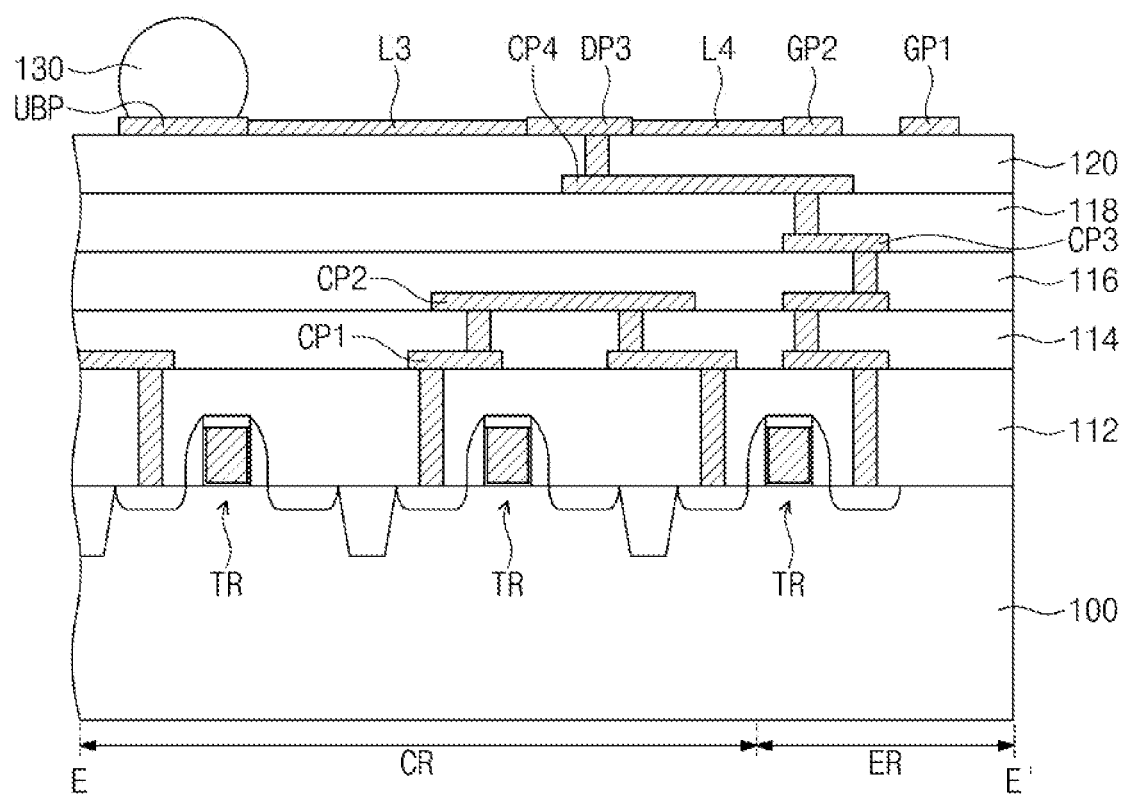

FIG. 9 illustrates a plan view of a semiconductor device according to some example embodiments, showing an arrangement of die pads and under-bump pads. FIGS. 10 and 11 illustrate cross-sectional views respectively taken along lines D-D' and E-E' of FIG. 11. In the example embodiment illustrated in FIGS. 9-11, the same reference numerals will be allocated to the same components of the semiconductor device discussed with reference to FIGS. 6-8, and a detailed description of technical features repetitive to those discussed above with reference to FIGS. 6 to 8 will be omitted for conciseness, and a difference thereof will be explained in detail.

Referring to FIGS. 9 to 11, a plurality of grouping patterns GP1 and GP2 may be provided. For example, a first grouping pattern GP1 and a second grouping pattern GP2 may be disposed on the fifth redistribution layer 120 on the peripheral region ER.

The first grouping pattern GP1 may extend along the outer edge of the fifth redistribution layer 120. The first grouping pattern GP1 may have a ring shape that extends along the peripheral region ER.

The second grouping pattern GP2 may extend along the outer edge of the fifth redistribution layer 120. The second grouping pattern GP2 may have a shape that extends along the peripheral region ER. The second grouping pattern GP2 may not have a closed curved shape when viewed in plan view. The second grouping pattern GP2 may have one or more openings OP. For example, in some example embodiments, the second grouping pattern GP2 may have an opening OP at which one side thereof is opened. For example, in other example embodiments, the second grouping pattern GP2 may be provided in plural and a plurality of openings OP may be provided, and thus the plurality of second grouping patterns GP2 may be arranged spaced apart from each other along the outer edge of the fifth redistribution layer 120.

When viewed in plan view, the second grouping pattern GP2 may be disposed inside the first grouping pattern GP1. The first grouping pattern GP1 may be spaced apart from the second grouping pattern GP2. The first grouping pattern GP1 may be closer than the second grouping pattern GP2 the outer edge of the fifth redistribution layer 120. When viewed in plan view, the under-bump pads UBP, the first die pads DP1, the second die pads DP2, and the third die pads DP3 may be disposed inside the second grouping pattern GP2.

The first grouping pattern GP1 may be connected to the first die pads DP1. The first die pads DP1 may all be coupled to the first grouping pattern GP1, and the first grouping pattern GP1 may be connected through the first die pads DP1 to ground circuits or electrostatic discharge (ESD) protection circuits of the integrated devices formed on the semiconductor substrate 100. For example, the first die pads DP1 may be coupled through the first wiring lines L1 to the first grouping pattern GP1. The first wiring line L1 may pass through the opening OP of the second grouping pattern GP2 and may then extend toward the first grouping pattern GP1. The first wiring line L1 may be connected to the first grouping pattern GP1 without being coupled to the second grouping pattern GP2. In some example embodiments, the first die pads DP1 may all be connected to the first grouping pattern GP1 to be combined in a group. Therefore, the first die pads DP1 and the first grouping pattern GP1 may decrease in overall resistance, and the semiconductor die 20 may increase in electrical characteristics. In some example embodiments, the first grouping pattern GP1 may mutually connect ground circuits or electrostatic discharge (ESD) protection circuits of the integrated devices formed on the semiconductor substrate 100 and may supply uniform ground voltages to the ground circuits or the ESD protection circuits. Accordingly, the semiconductor die 20 may increase in operating reliability.

The second grouping pattern GP2 may be connected to the third die pads DP3. In some example embodiments, the third die pads DP3 may all be coupled to the second grouping pattern GP2, and the second grouping pattern GP2 may be connected through the third die pads DP3 to a memory or logic circuit of the integrated devices formed on the semiconductor substrate 100. For example, each of the third die pads DP3 may be coupled through a fourth wiring lines L4 to the second grouping pattern GP2. In some example embodiments, the third die pads DP3 may all be connected to the second grouping pattern GP2 to be combined in a group. Therefore, the third die pads DP3 and the second grouping pattern GP2 may decrease in overall resistance, and the semiconductor die 20 may increases in electrical characteristics. The second grouping pattern GP2 may supply uniform power voltages to a memory or logic circuit of the integrated devices formed on the semiconductor substrate 100. Accordingly, the semiconductor die 20 may increase in operating reliability.

Figure 12:
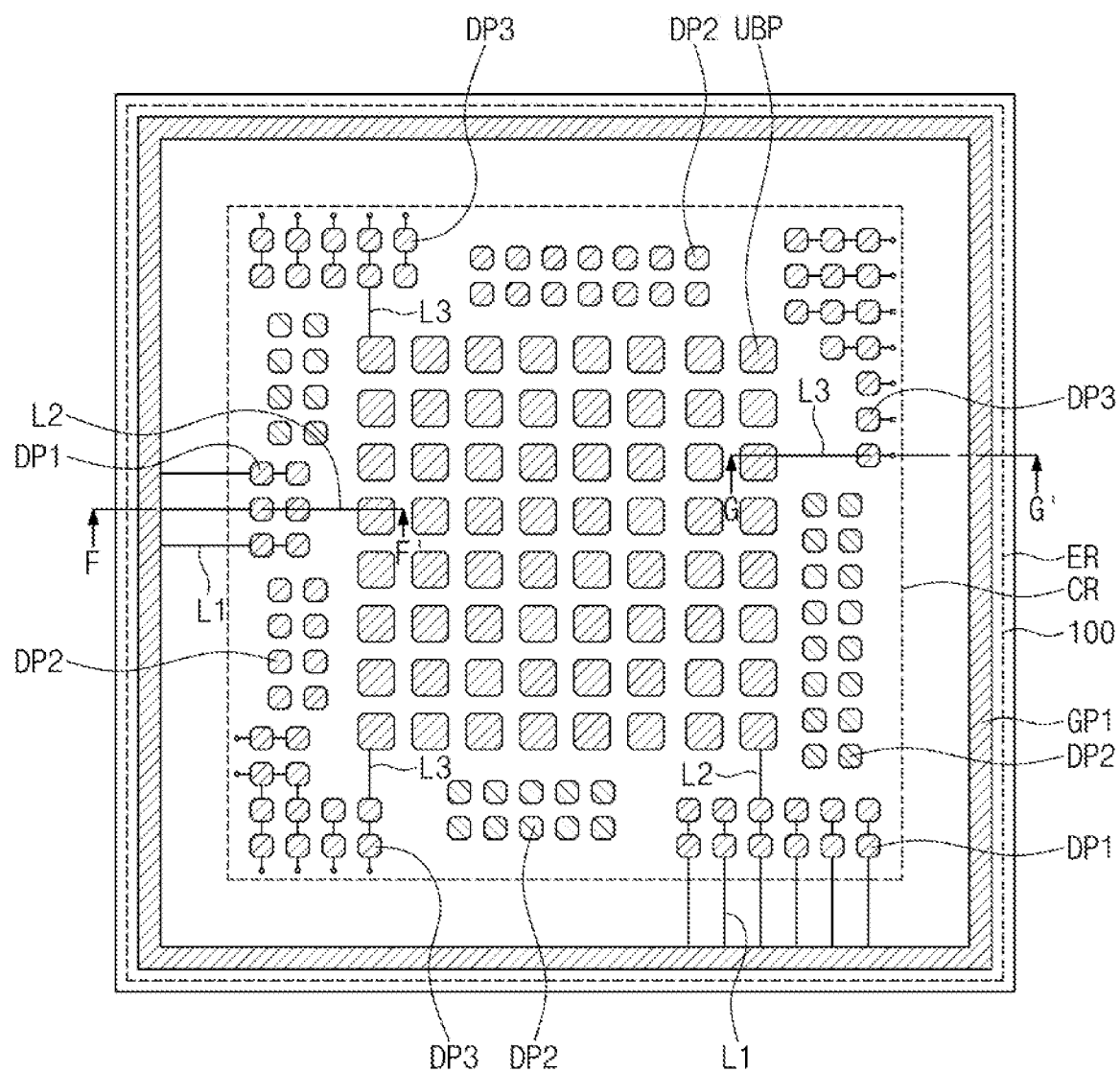
FIG. 12 illustrates a plan view showing a semiconductor device according to some example embodiments.
Figure 13:
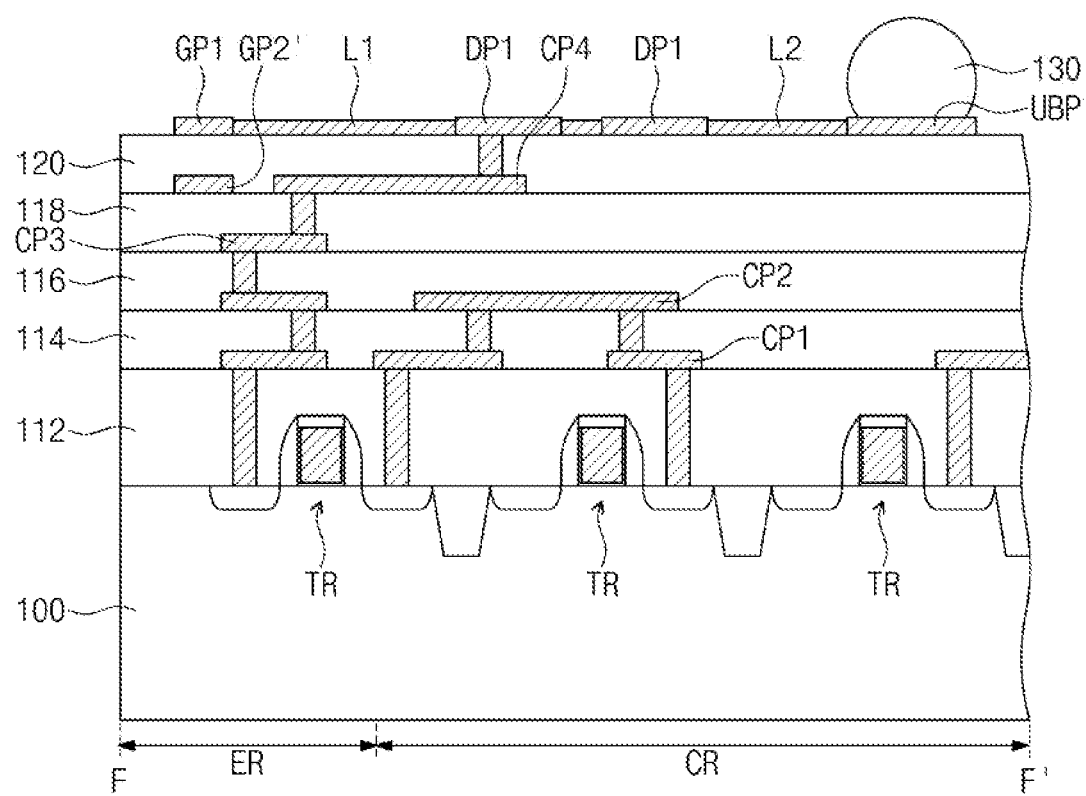
FIGS. 13 and 14 illustrate cross-sectional views showing sections F-F' and G-G', respectively, of the semiconductor device of FIG. 12, according to some example embodiments.
Figure 14:
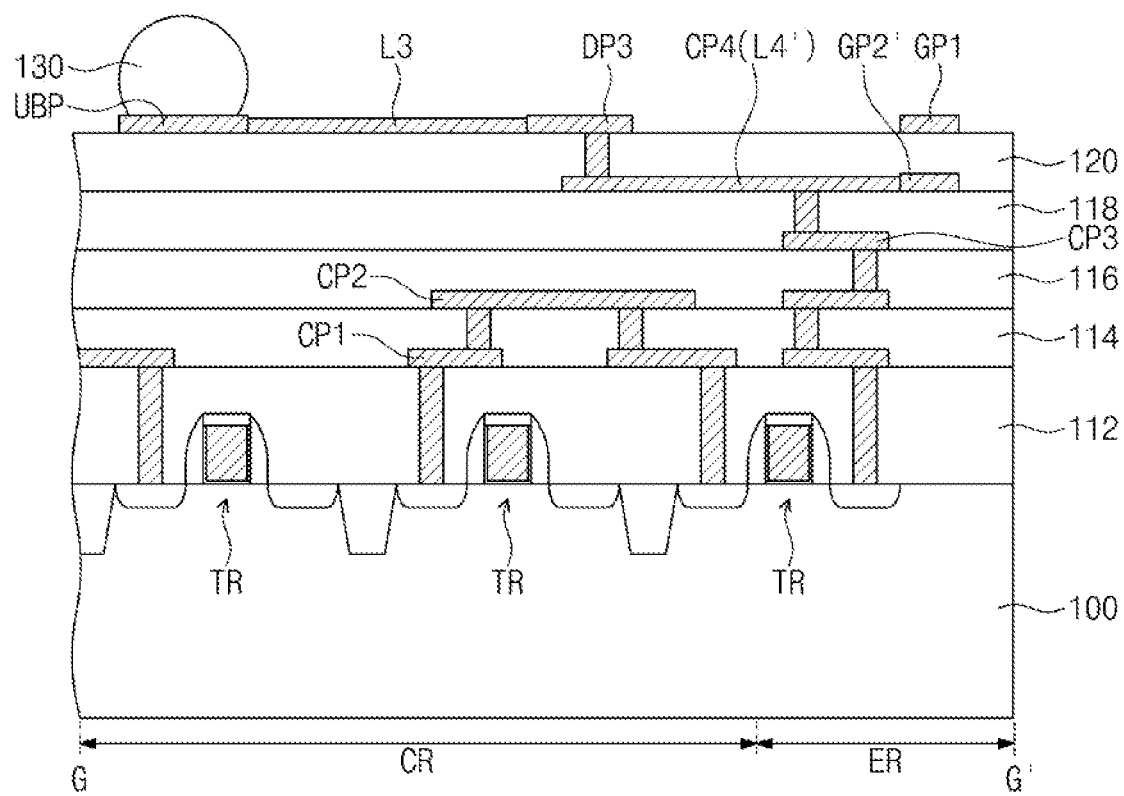

FIG. 12 illustrates a plan view of a semiconductor device according to some example embodiments, showing an arrangement of die pads and under-bump pads. FIGS. 13 and 14 cross-sectional views respectively taken along lines F-F' and G-G' of FIG. 12. In the example embodiment illustrated in FIGS. 12-14, the same reference numerals will be allocated to the same components of the semiconductor device discussed with respect to FIGS. 6-11, and a detailed description of technical features repetitive to those discussed above with reference to FIGS. 6 to 11 will be omitted for conciseness, and a difference thereof will be explained in detail.

Referring to FIGS. 12 to 14, the fifth redistribution layer 120 may be provided thereon with under-bump pads UBP, first die pads DP1, second die pads DP2, third die pads DP3, and a first grouping pattern GP1. The under-bump pads UBP, the first die pads DP1, and the second die pads DP2 may be the same as the under-bump pads UBP, the first die pads DP1, and the second die pads DP2, respectively, discussed with reference to FIGS. 2 to 4.

The first die pads DP1 may be pads through which ground voltages are supplied to the integrated devices of the semiconductor substrate 100, and the second die pads DP2 may be pads through which data signals are supplied to the integrated devices of the semiconductor substrate 100. The semiconductor substrate 100 may have, on the central region CR, the third die pads DP3 disposed on the top surface of the fifth redistribution layer 120. The third die pads DP3 may be coupled to the fourth conductive pattern CP4 of the fifth redistribution layer 120. The third die pads DP3 may be connected through the first, second, third, fourth, and fifth redistribution layers 112, 114, 116, 118, and 120 to the integrated devices of the semiconductor substrate 100. The third die pads DP3 may be supplied with power voltages. For example, the third die pads DP3 may be connected to at least one of the transistors TR formed on the semiconductor substrate 100, and a memory or logic circuit may be constituted by the transistors TR connected to the third die pads DP3. The third die pads DP3 be connected through the third wiring line L3 to at least one of the under-bump pads UBP.

The first grouping pattern GP1 may be provided. For example, the first grouping pattern GP1 may be disposed on the fifth redistribution layer 120 on the peripheral region ER. The first grouping pattern GP1 may extend along the outer edge of the fifth redistribution layer 120. The first grouping pattern GP1 may have a ring shape that extends along the peripheral region ER.

The first grouping pattern GP1 may be connected to the first die pads DP1. In some example embodiments, the first die pads DP1 may all be coupled to the first grouping pattern GP1, and the first grouping pattern GP1 may be connected through the first die pads DP1 to ground circuits or electrostatic discharge (ESD) protection circuits of the integrated devices formed on the semiconductor substrate 100. For example, the first die pads DP1 may be coupled through the first wiring lines L1 to the first grouping pattern GP1. The first die pads DP1 may all be connected to the first grouping pattern GP1 to be combined in a group.

A second grouping pattern GP2' may be provided at a different level from that of the first grouping pattern GP1. For example, the second grouping pattern GP2' may be disposed on the fourth redistribution layer 118 on the peripheral region ER. The fifth redistribution layer 120 may bury the second grouping pattern GP2'. The second grouping pattern GP2' may be disposed below the first grouping pattern GP1. For example, in some example embodiments, the second grouping pattern GP2' may vertically overlap the first grouping pattern GP1. However, example embodiments are not limited thereto. That is, a position of the second grouping pattern GP2' is not limited to a position below the first grouping pattern GP1, and the second grouping pattern GP2' may be freely placed on the fourth redistribution layer 118 on the peripheral region ER. The second grouping pattern GP2' may extend along an outer edge of the fourth redistribution layer 118. The second grouping pattern GP2' may have a ring shape that extends along the peripheral region ER.

The second grouping pattern GP2' may be connected to the third die pads DP3. For example, the third die pads DP3 may be connected to a portion L4' of the fourth conductive pattern CP4 of the fourth redistribution layer 118, and the portion L4' connected to the third die pads DP3 may be coupled to the second grouping pattern GP2'. In some example embodiments, the third die pads DP3 may all be coupled to the second grouping pattern GP2', and the second grouping pattern GP2' may be connected through the third die pads DP3 to a memory or logic circuit of the integrated devices formed on the semiconductor substrate 100. For example, each of the third die pads DP3 may be coupled to the second grouping pattern GP2' through the portion L4' of the fourth conductive pattern CP4 of the fourth redistribution layer 118. The third die pads DP3 may all be connected to the second grouping pattern GP2' to be combined in a group.

The example embodiments of FIGS. 12 to 14 depict that the second grouping pattern GP2' is provided on the fourth redistribution layer 118, but example embodiments are not limited thereto. According to some example embodiments, the second grouping pattern GP2' may be provided on the third redistribution layer 116 or the second redistribution layer 114, and the third die pads DP3 may be connected to the second grouping pattern GP2' through a portion of the third conductive pattern CP3 or a portion of the second conductive pattern CP2 to be combined in a group.

A semiconductor device according to some example embodiments may be configured such that die pads for transferring ground signals may all be connected to a grouping pattern to be combined in a group. Therefore, the die pads, and the grouping pattern may decrease in overall resistance, and a semiconductor die may increase in electrical characteristics.

In addition, in some example embodiments, ground circuits or electrostatic discharge (ESD) protection circuits of integrate elements formed on a semiconductor device may be connected to the grouping pattern and thus may be supplied with uniform ground voltages, and the semiconductor die may improve in operating reliability.

Moreover, in semiconductor die fabrication processes such as sawing, the grouping pattern may protect die pads, under-bump pads, and wiring lines against stress or strain delivered from an outer edge. Accordingly, the semiconductor device may increase in structural stability.

Although various example embodiments have been described herein and illustrated in the accompanying drawings, it will be understood by one of ordinary skill in the art that variations in form and detail may be made therein without departing from the spirit and scope of the accompanying claims. The above disclosed example embodiments should thus be considered illustrative and not restrictive.

What is claimed is:

1. A semiconductor device comprising:
   a semiconductor substrate;
   at least one integrated device on a front surface of the semiconductor substrate;
   a first redistribution layer on the semiconductor substrate, the first redistribution layer having a plurality of first conductive patterns electrically connected to the at least one integrated device;
   a second redistribution layer on the first redistribution layer, the second redistribution layer having a plurality of second conductive patterns connected to the plurality of first conductive patterns; and
   a plurality of third conductive patterns on a top surface of the second redistribution layer,
   wherein the plurality of third conductive patterns include:
   a plurality of pads connected to the plurality of second conductive patterns;
   a plurality of under-bump pads spaced apart from the plurality of pads;
   a grouping pattern between the plurality of pads and an outer edge of the second redistribution layer; and
   a plurality of wiring lines that connect the plurality of under-bump pads to the plurality of pads and connect the plurality of pads to the grouping pattern, wherein the plurality of pads, the plurality of under-bump pads, the grouping pattern, and the plurality of wiring lines are located at the same level from the semiconductor substrate.

2. The semiconductor device of claim 1, wherein
the grouping pattern has a ring shape that extends along the outer edge of the second redistribution layer, and
when viewed in plan view, the plurality of pads and the plurality of under-bump pads are provided inside the grouping pattern.

3. The semiconductor device of claim 1, wherein, on a straight line that links a center of the second redistribution layer and the outer edge of the second redistribution layer, the grouping pattern is closer than the plurality of pads to the outer edge of the second redistribution layer.

4. The semiconductor device of claim 1, wherein the plurality of pads are connected through the second redistribution layer and the first redistribution layer to a ground circuit of the at least one integrated device or to a power circuit of the at least one integrated device.

5. The semiconductor device of claim 4, wherein
the grouping pattern is provided in plural, and
the plurality of grouping patterns include a first grouping pattern connected to the ground circuit and a second grouping pattern connected to the power circuit.

6. The semiconductor device of claim 5, wherein
the first grouping pattern is provided in plural,
the plurality of first grouping patterns are arranged along the outer edge of the second redistribution layer,
the second grouping pattern has a ring shape that extends along the outer edge of the second redistribution layer, and
the second grouping pattern is closer than the plurality of first grouping patterns to the outer edge of the second redistribution layer.

7. The semiconductor device of claim 5, wherein
each of the first grouping pattern and the second grouping pattern has a ring shape that extends along the outer edge of the second redistribution layer, and
one of the first grouping pattern and the second grouping pattern is electrically connected to the plurality of pads through a portion of the plurality of second conductive patterns of the second redistribution layer, the one of the first grouping pattern and the second grouping pattern being closer than the other of the first grouping pattern and the second grouping pattern to the outer edge of the second redistribution layer.

8. The semiconductor device of claim 1, further comprising a plurality of solder balls coupled to the plurality of under-bump pads.

9. The semiconductor device of claim 1, wherein a distance from the outer edge of the second redistribution layer to the grouping pattern is in a range of about 4 μm to about 80 μm.

10. A semiconductor device comprising:
a semiconductor substrate that includes a plurality of integrated devices on a front surface of the semiconductor substrate;
a redistribution layer on the semiconductor substrate;
a plurality of pads and a plurality of under-bump pads on a central region of the redistribution layer; and
a first grouping pattern on a peripheral region of the redistribution layer, the peripheral region being spaced apart from and surrounding the central region,
wherein the plurality of pads include:
a plurality of first pads connected to a signal circuit of the plurality of integrated devices; and
a plurality of second pads connected to the first grouping pattern and a ground circuit of the plurality of integrated devices.

11. The semiconductor device of claim 10, wherein the first grouping pattern has a ring shape that extends along an outer edge on the peripheral region of the redistribution layer.

12. The semiconductor device of claim 10, further comprising a plurality of first wiring lines that extend from the plurality of second pads and are coupled to the first grouping pattern.

13. The semiconductor device of claim 10, further comprising a second grouping pattern on the peripheral region of the redistribution layer, the second grouping pattern being spaced apart from and surrounding the first grouping pattern,
wherein the plurality of pads further include a plurality of third pads connected to the second grouping pattern and a power circuit of the plurality of integrated devices.

14. The semiconductor device of claim 13, wherein
when viewed in plan view, the first grouping pattern extends along an outer edge on the peripheral region of the redistribution layer and has an opening, and
when viewed in plan view, the second grouping pattern has a ring shape that extends along the outer edge on the peripheral region of the redistribution layer.

15. The semiconductor device of claim 14, further comprising a plurality of second wiring lines that extend through the opening from the plurality of third pads and are coupled to the second grouping pattern.

16. The semiconductor device of claim 10, wherein ground circuits of the plurality of integrated devices are all connected to each other by the first grouping pattern.

17. The semiconductor device of claim 10, further comprising a plurality of solder balls coupled to the plurality of under-bump pads.

18. A semiconductor device comprising:
a semiconductor die;
a dielectric pattern on an active surface of the semiconductor die;
a first conductive pattern in the dielectric pattern;
a second conductive pattern on a top surface of the dielectric pattern; and
a plurality of solder bumps on the second conductive pattern,
wherein the second conductive pattern includes:
a grouping pattern having a ring shape that extends along an outer edge of the dielectric pattern;
a plurality of under-bump pads on the top surface of the dielectric pattern; and
a plurality of die pads connected to the plurality of under-bump pads and the grouping pattern,
wherein a distance from the outer edge of the dielectric pattern to the grouping pattern is less than a distance from the outer edge of the dielectric pattern to the plurality of under-bump pads and the distance from the outer edge of the dielectric pattern to the grouping pattern is less than a distance from the outer edge of the dielectric pattern to the plurality of die pads, and
wherein a plurality of ground circuits in the semiconductor die are connected to the grouping pattern and have the same electrical potential.

19. The semiconductor device of claim 18, wherein, when viewed in plan view, the plurality of die pads and the plurality of under-bump pads are positioned inside the grouping pattern.

* * * * *